(12) United States Patent
Murayama et al.

(10) Patent No.: US 11,806,687 B2
(45) Date of Patent: Nov. 7, 2023

(54) ACTIVE ENERGY RADIATION UNIT AND ACTIVE ENERGY RADIATION DEVICE

(71) Applicant: HAMAMATSU PHOTONICS K.K., Hamamatsu (JP)

(72) Inventors: Kyoichi Murayama, Hamamatsu (JP); Keita Umeno, Hamamatsu (JP); Ryotaro Matui, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 750 days.

(21) Appl. No.: 16/997,112

(22) Filed: Aug. 19, 2020

(65) Prior Publication Data
US 2021/0060517 A1    Mar. 4, 2021

(30) Foreign Application Priority Data
Aug. 26, 2019  (JP) ................. 2019-153803

(51) Int. Cl.
*B01J 19/12*   (2006.01)
*B01J 19/14*   (2006.01)
*B41F 23/04*   (2006.01)
*B41J 11/00*   (2006.01)

(52) U.S. Cl.
CPC .......... *B01J 19/123* (2013.01); *B01J 19/14* (2013.01); *B41F 23/0453* (2013.01); *B41J 11/002* (2013.01); *B41J 11/00214* (2021.01)

(58) Field of Classification Search
CPC ...... B01J 19/123; B01J 19/14; B41F 23/0453; B41J 11/002; B41J 11/00214; H01L 21/6776; H01L 21/67115; B05D 3/0466; B05D 3/065
See application file for complete search history.

(56) References Cited

U.S. PATENT DOCUMENTS

| | | |
|---|---|---|
| 2009/0207223 A1 | 8/2009 | Cofler et al. |
| 2019/0054745 A1* | 2/2019 | Taguchi ............... B01J 4/04 |
| 2021/0060978 A1* | 3/2021 | Murayama ............ B05D 3/065 |

FOREIGN PATENT DOCUMENTS

| | | |
|---|---|---|
| EP | 3 437 728 A1 | 2/2019 |
| JP | S60-235793 A | 11/1985 |
| JP | 2003-001206 A | 1/2003 |
| JP | 2005-235869 A | 9/2005 |
| JP | 2012-166539 A | 9/2012 |
| WO | WO 2017/145635 A1 | 8/2017 |
| WO | WO-2018/074283 A1 | 4/2018 |
| WO | WO-2019/151148 A1 | 8/2019 |
| WO | WO-2020/022424 A1 | 1/2020 |

OTHER PUBLICATIONS

US 10,562,320, 2/2020, Kyocera Corp (withdrawn)

\* cited by examiner

*Primary Examiner* — Kiet T Nguyen
(74) *Attorney, Agent, or Firm* — Faegre Drinker Biddle & Reath LLP

(57) ABSTRACT

An active energy radiation unit includes a light source which radiates ultraviolet rays onto a target object, and a main gas supply mechanism which is disposed to be adjacent to the light source and ejects an inert gas. The main gas supply mechanism includes a receiving part which receives nitrogen gas, a first ejection port which is provided at a position between the receiving part and the light source in a transfer direction and closer to the target object than the receiving part and a second ejection port which is provided between the receiving part and the first ejection port in the transfer direction.

7 Claims, 15 Drawing Sheets

ACTIVE ENERGY RADIATION UNIT AND ACTIVE ENERGY RADIATION DEVICE

TECHNICAL FIELD

The present invention relates to an active energy radiation unit and an active energy radiation device.

BACKGROUND

Patent Document 1 discloses an active energy ray radiation device as a device for forming a film on a surface of a medium. The active energy ray radiation device radiates active energy rays onto a material applied to the medium. The material applied to the medium is cured by radiating the active energy rays. As a result, the film is formed on the surface of the medium.

RELATED ART DOCUMENTS

Patent Document

[Patent Document 1] Japanese Unexamined Patent Publication No. 2012-166539

SUMMARY

As also described in Patent Document 1, it is known that a curing operation of a film material that cures by receiving active energy rays is hindered by oxygen existing around the film material. Therefore, an optical processing result in accordance with the oxygen concentration that the vicinity of a region irradiated with the active energy rays is obtained. A desired processing result can be obtained in a region in which the oxygen concentration is low. However, a desired processing result may not be obtained in a region in which the oxygen concentration is high.

The present invention provides an active energy radiation unit and an active energy radiation device by which a region in which a desired processing result is obtained can be enlarged.

An active energy radiation unit according to one aspect of the present invention includes an active energy radiation part which radiates active energy rays onto a target object disposed in an active energy radiation region extending in a first direction, a main gas supply mechanism which extends in the first direction, is disposed to be adjacent to the active energy radiation part in a second direction intersecting the first direction, and ejects an inert gas for forming an inactive region including the active energy radiation region between the target object and the active energy radiation part. The main gas supply mechanism includes a receiving part which receives the inert gas, a first ejection port which is provided between the receiving part and a light source in a transfer direction and is closer to the target object than the receiving part, and a second ejection port which is provided between the receiving part and the first ejection port in the transfer direction.

This active energy radiation unit has the main gas supply mechanism disposed adjacent to the active energy radiation part. The inert gas is ejected from the first ejection port of the main gas supply mechanism. The ejected inert gas becomes a first flow and flows downstream. Then, the inert gas forms the inactive region having a low oxygen concentration around the active energy radiation region. Further, the inert gas is ejected from the second ejection port of the main gas supply mechanism. The second ejection port is disposed on an upstream side of the first ejection port in the transfer direction. From the second ejection port, a second flow of the inert gas which is directed vertically downward toward the target object is generated. As described above, the first flow of the inert gas forms the inactive region having a low oxygen concentration around the active energy radiation region. The first flow of inert gas induces a flow of air toward the active energy radiation region. That is, the air containing oxygen is supplied toward the active energy radiation region. The second flow of the inert gas flows vertically downward toward the target object. The vertically downward flow of the inert gas can block a flow of air toward the active energy radiation region. Therefore, the active energy radiation unit can form the inactive region around the active energy radiation region by supplying the inert gas to the active energy radiation region. Further, the active energy radiation unit can block air supply to the active energy radiation region using the flow of the inert gas directed vertically downward. As a result, the region in which the oxygen concentration is kept low is enlarged in the vicinity of the active energy radiation region. Therefore, a region in which a desired processing result is obtained can be enlarged.

In one aspect, the active energy radiation unit may further include a sub gas supply mechanism which extends in the second direction, is disposed to sandwich the active energy radiation region in the first direction, and ejects the inert gas. An airflow toward the active energy radiation region is also provided from a side part side of the active energy radiation region. The airflow from the side part side of the active energy radiation region toward the active energy radiation region can be blocked by the sub gas supply mechanism. As a result, the region in which the desired processing result is obtained can be further enlarged.

In one aspect, one end of the sub gas supply mechanism in the second direction may be connected to the main gas supply mechanism. The active energy radiation part may be disposed between the one end of the sub gas supply mechanism and the other end of the sub gas supply mechanism in the second direction. According to these configurations, the active energy radiation part is disposed in a region surrounded by the main gas supply mechanism and the sub gas supply mechanism. Therefore, the inactive region including the active energy radiation region can be reliably formed.

In one aspect, the main gas supply mechanism may further have an introduction part to which a gas pipe for supplying a compressed inert gas is connected, a first flow path part which receives the inert gas from the introduction part, and a second flow path part which receives the inert gas from the first flow path part and provides the inert gas to the receiving part. A flow path area of the first flow path part may be larger than flow path areas of the introduction part and the second flow path part. The first flow path part may be formed by a rectifying slope surface which is disposed to intersect an axis of the introduction part and obstructs a flow of the inert gas received from the introduction part. According to these configurations, the flow of the inert gas received from the introduction part spreads in a predetermined direction due to the operation of the rectifying surface that obstructs the flow of the inert gas. As a result, a flow rate distribution of the inert gas ejected from the first ejection port in the predetermined direction is formed to be uniform. Therefore, the flow rate of the inert gas required to form the inactive region can be reduced.

In one aspect, the rectifying surface may be a slope surface that is inclined with respect to the axis of the introduction part. According to this configuration, the flow of the inert gas can be changed smoothly.

An active energy radiation device according to another aspect of the present invention includes the active energy radiation unit described above, a transfer part which causes a relative movement of the target object with respect to the active energy radiation region. This active energy radiation device includes the active energy radiation unit described above. Therefore, similar to the active energy radiation unit, the region in which the oxygen concentration is kept low is enlarged in the vicinity of the active energy radiation region. As a result, the region in which the desired processing result is obtained can be enlarged.

In another aspect, the transfer part transfers the target object, and the second direction may be the transfer direction of the target object. According also to this configuration, it is possible to properly obtain the effect that the region in which the desired processing result is obtained can be enlarged.

According to the present invention, an active energy radiation unit and an active energy radiation device by which a region in which a desired processing result is obtained can be enlarged are provided.

DETAILED DESCRIPTION

Hereinafter, aspects for carrying out the present invention will be described in detail with reference to the accompanying drawings. In description of the drawings, the same elements will be denoted by the same reference signs and repeated descriptions thereof will be omitted.

Figure 1:
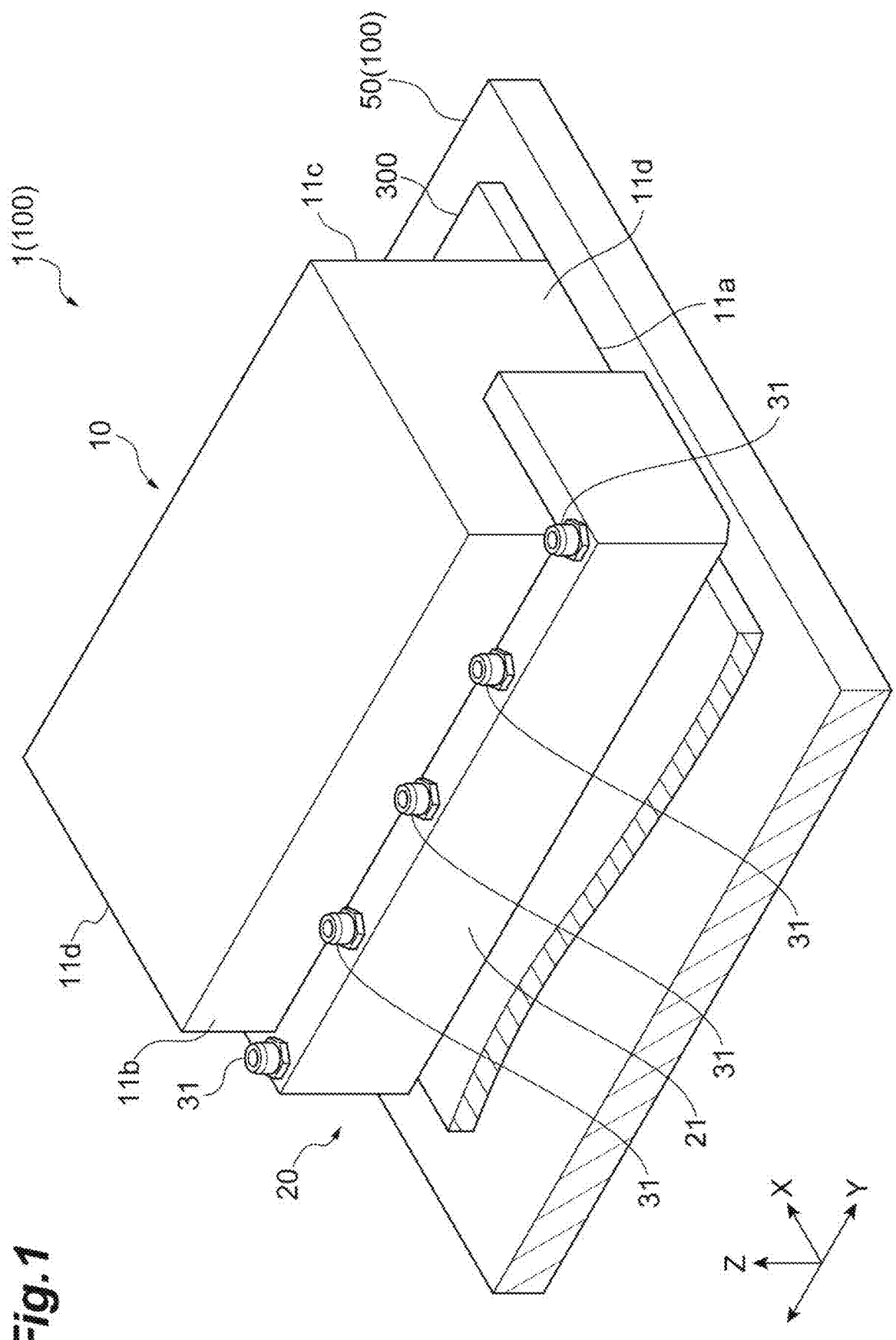
FIG. 1 is a perspective view showing an active energy radiation device of an embodiment.

FIG. 1 shows an active energy radiation device 100. The active energy radiation device 100 radiates active energy rays onto a moving target object 300. A resin material is applied to the target object 300. Examples of the active energy rays include ultraviolet rays and electron beams. Examples of uses of the active energy radiation device 100 include printing and packaging. For example, the active energy radiation device 100 that radiates ultraviolet rays is used for processing a photocurable resin. Examples of the photocurable resin include a UV curable resin that is cured by light energy of ultraviolet rays. In addition, among resins that are cured by receiving energy, there are also resins that are cured by receiving energy from an electron beam. Therefore, the active energy radiation device 100 that radiates an electron beam can also be used for processing an electron beam curable resin. In the following description, an active energy radiation device 100 used for processing a UV curable resin will be exemplified.

A drying rate of a UV curable resin is affected by oxygen. Specifically, oxygen hinders curing of a UV curable resin. Therefore, a concentration of oxygen in a region in which a UV curing resin is cured is lowered. In other words, a concentration of oxygen in a region in which a UV curable resin is irradiated with ultraviolet rays is lowered. For example, a region in which an inert gas is predominant is formed with respect to a region including a radiation region of ultraviolet rays. Such a region in which an inert gas is predominant is called a purge region. Examples of the inert gas include nitrogen.

The active energy radiation device 100 forms a purge region and radiates ultraviolet rays onto a UV curable resin in the purge region. More specifically, the active energy radiation device 100 radiates ultraviolet rays onto the UV curable resin applied to a surface of the target object 300. The active energy radiation device 100 is fixed to a structure (not shown). That is, the active energy radiation device 100 does not move. On the other hand, the target object 300 is continuously moved by a transfer device 50 in a transfer direction X (a second direction). Examples of the target object 300 include papers, films, and sheets.

The active energy radiation device 100 includes the active energy radiation unit 1 and the transfer device 50 (a transfer part) as main components.

The transfer device 50 causes a relative movement of the target object 300 with respect to the active energy radiation region, which will be described later.

The active energy radiation unit 1 has a light radiation part 10 and a purge part 20 as main components.

Figure 2:
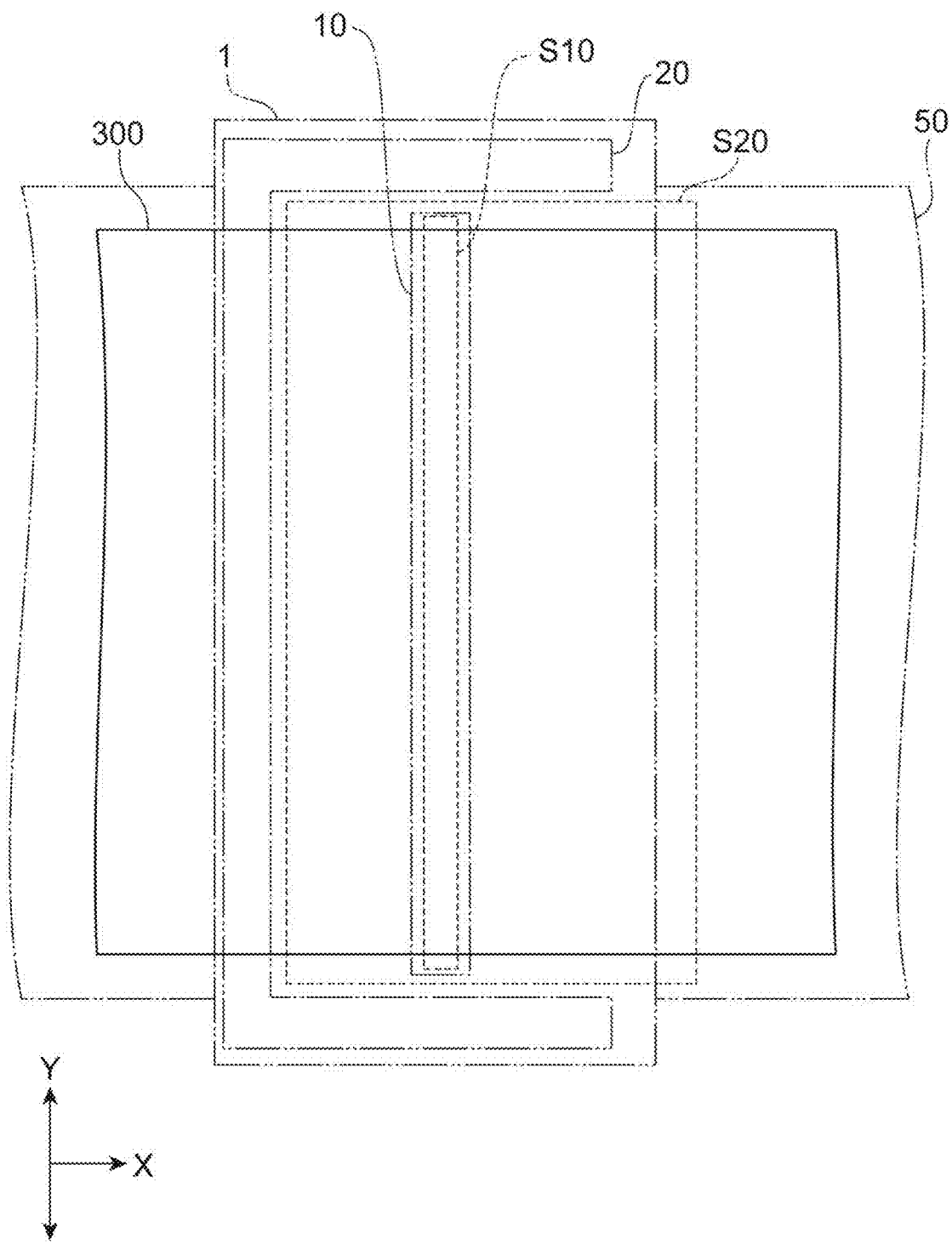
FIG. 2 is a diagram showing an active energy radiation region and a purge region.

As shown in FIG. 2, the light radiation part 10 radiates ultraviolet rays (active energy rays) onto the active energy radiation region S10. The target object 300 is transferred by the transfer device 50 through the active energy radiation region S10. Therefore, the target object 300 receives the ultraviolet rays while being transferred in the transfer direction X. The purge part 20 forms a purge region S20. An oxygen concentration of the purge region S20 is lower than an oxygen concentration of air. The purge part 20 forms the purge region S20 by ejecting an inert gas.

The purge region S20 includes at least the active energy radiation region S10. The purge region S20 may include a region on an upstream side of the active energy radiation region S10 and a region on a downstream side of the active energy radiation region S10. The region on the upstream side of the active energy radiation region S10 and the region on the downstream side of the active energy radiation region S10 are arranged in the transfer direction X. The purge region S20 may include a region sandwiching the active energy radiation region S10 in a direction (a width direction Y: a first direction) intersecting the transfer direction X.

Figure 3:
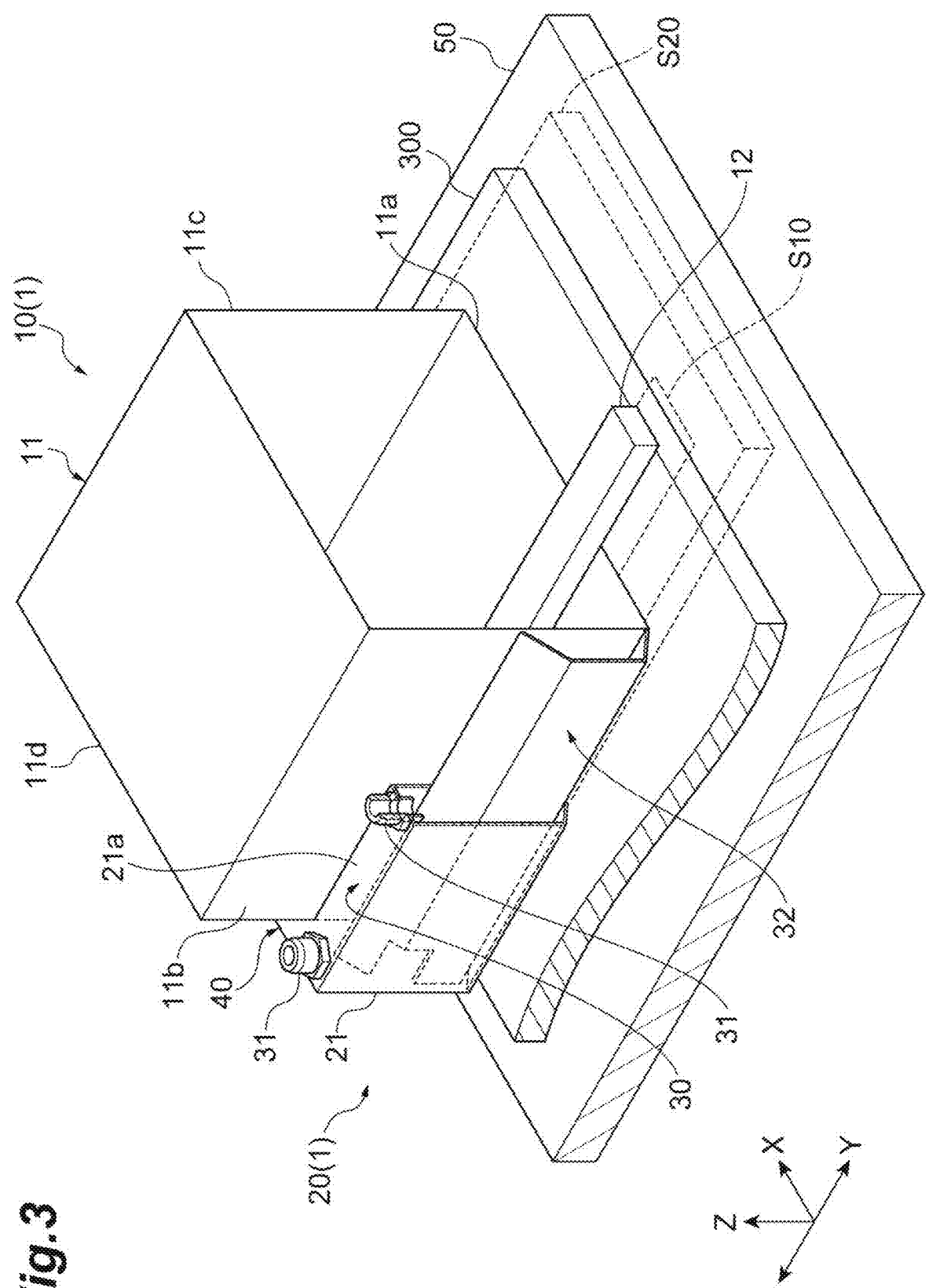
FIG. 3 is a perspective view showing an internal structure of an active energy radiation unit.

As shown in FIG. 3, the light radiation part 10 includes a radiation housing 11 and a light source 12 (active energy radiation part). The radiation housing 11 constitutes a base body of the light radiation part 10. A shape of the radiation housing 11 is, for example, a rectangular parallelepiped. The radiation housing 11 includes a radiation main surface 11a facing the target object 300, a radiation front surface 11b on an upstream side in the transfer direction X, a radiation back surface 11c on a downstream side in the transfer direction X, and a pair of radiation side surfaces 11d. The radiation housing 11 accommodates various components that constitute the light radiation part 10 including the light source 12. For example, the radiation housing 11 may accommodate a power supply board that supplies electric power to the light source 12 and a control board for the light source 12.

The light source 12 emits light which is radiated on the active energy radiation region S10. The active energy radiation region S10 is set below the radiation housing 11. The active energy radiation region S10 has a rectangular shape in a plan view. The active energy radiation region S10 extends in the width direction Y orthogonal to the transfer direction X. The light source 12 radiates light on the active energy radiation region S10. The light source 12 extends in the width direction Y orthogonal to the transfer direction X. As an example, a width of the light source 12 is longer than a width of the radiation housing 11. Also, the width of the light source 12 may be substantially the same as the width of the radiation housing 11. The light emitted by the light source 12 is ultraviolet light. The light source 12 is attached to the radiation main surface 11a of the radiation housing 11. The light source 12 is disposed on a downstream side in the transfer direction X a predetermined distance from the radiation front surface 11b. For example, a distance from the radiation front surface 11b to the light source 12 in the transfer direction X may be shorter than a distance from the light source 12 to the radiation back surface 11c.

The purge part 20 has a main gas supply mechanism 30 and a sub gas supply mechanism 40. The main gas supply mechanism 30 and the sub gas supply mechanism 40 are integrated by a purge housing 21.

<Main Gas Supply Mechanism>

Figure 4:
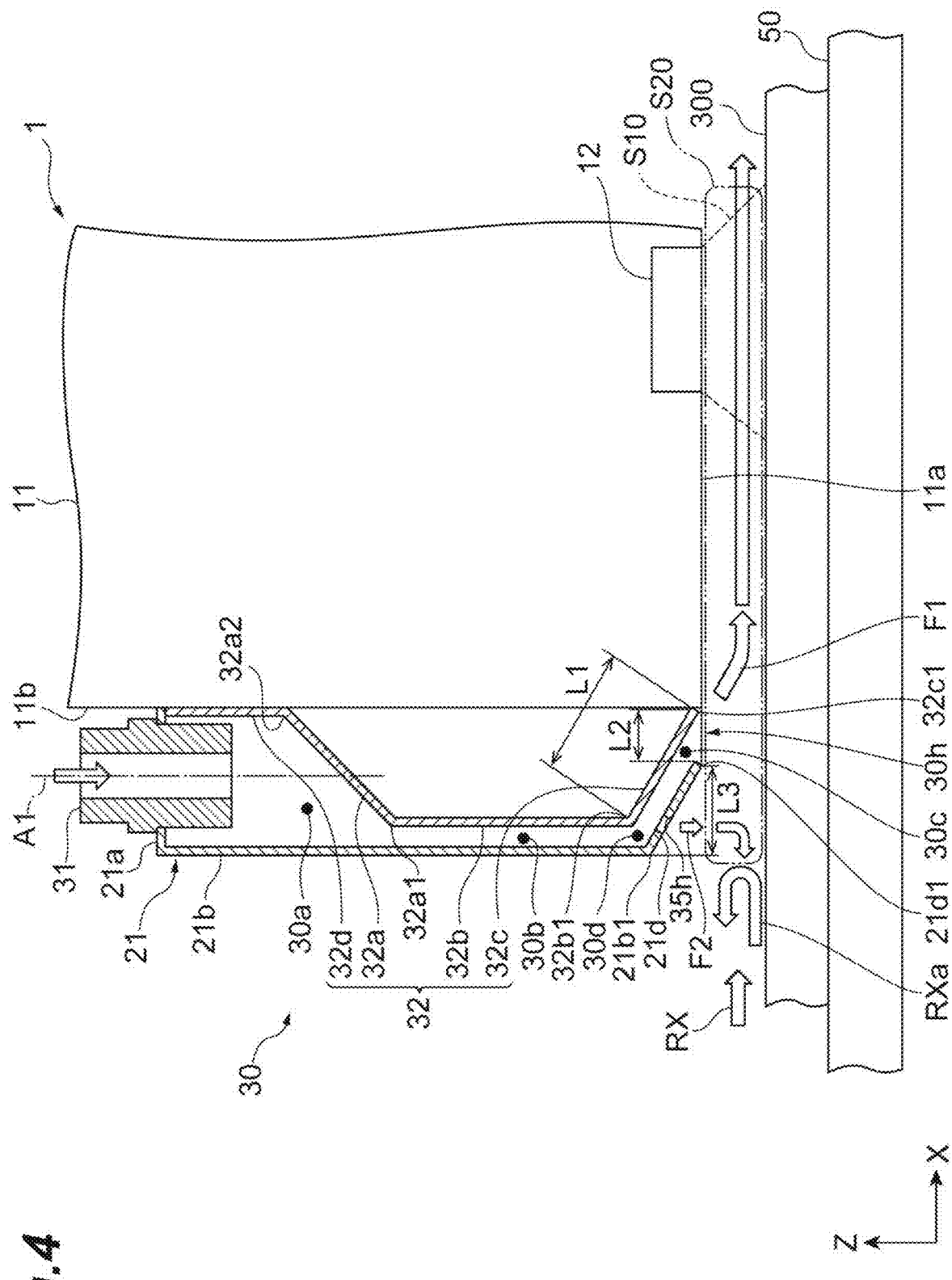
FIG. 4 is a cross-sectional view showing a main gas supply mechanism.

As shown in FIG. 4, the main gas supply mechanism 30 has a first ejection port 30h. The main gas supply mechanism 30 ejects nitrogen gas for forming the purge region S20 from the first ejection port 30h. The main gas supply mechanism 30 has a second ejection port 35h. The main gas supply mechanism 30 ejects nitrogen gas for blocking an airflow (see arrow RX) that tries to enter a gap between the target object 300 and the active energy radiation unit 1 from the second ejection port 35h. More specifically, as the target object 300 moves in the transfer direction X, air tries to enter from an upstream side of the active energy radiation unit 1. In other words, as the target object 300 moves, air tries to enter from between the radiation housing 11 and the target object 300. The main gas supply mechanism 30 ejects the nitrogen gas for inhibiting the airflow from the upstream side.

The main gas supply mechanism 30 is attached to the radiation front surface 11b of the radiation housing 11. The main gas supply mechanism 30 is disposed on an upstream side of the light source 12 in the transfer direction X. The main gas supply mechanism 30 extends in the width direction Y. For example, a width of the main gas supply mechanism 30 may be the same as the width of the radiation housing 11. Further, the width of the main gas supply mechanism 30 may be larger than the width of the radiation housing 11. The main gas supply mechanism 30 extends from one radiation side surface 11d to the other radiation side surface 11d.

A more detailed configuration of the main gas supply mechanism 30 will be described. The main gas supply mechanism 30 has a plurality of sockets 31 (introduction parts) and a rectifying plate 32.

Plugs (not shown) are inserted into each of the plurality of sockets 31. The plug is a tip of a pipe that provides compressed nitrogen gas. The socket 31 receives the compressed nitrogen gas. The plurality of sockets 31 are provided on a purge upper surface 21a of the purge housing 21. The plurality of sockets 31 are separated from each other at predetermined intervals in the width direction Y (see FIG. 1). The intervals between the plurality of sockets 31 may be, for example, equal intervals. An axis A1 of the socket 31 is orthogonal to the purge upper surface 21a. According to this configuration, the nitrogen gas is received downward (in a negative height direction Z) from the purge upper surface 21a.

The purge housing 21 and the rectifying plate 32 form a flow path through which the nitrogen gas received from the socket 31 passes. The purge housing 21 and the current plate 32 form the first ejection port 30h for ejecting the nitrogen gas.

The main gas supply mechanism 30 includes a first flow path part 30a, a second flow path part 30b, and a third flow path part 30c. The nitrogen gas received from the socket 31 passes through the first flow path part 30a, the second flow path part 30b, and the third flow path part 30c in order. Then, the nitrogen gas is ejected from the first ejection port 30h. Further, the nitrogen gas received from the socket 31 passes through the first flow path part 30a and the second flow path part 30b. Then, the nitrogen gas is also ejected from the second ejection port 35h provided in the middle of the third flow path part 30c.

The first flow path part 30a receives the nitrogen gas from the socket 31. Then, the first flow path part 30a provides the nitrogen gas to the second flow path part 30b. The first flow path part 30a is a region surrounded by the purge upper surface 21a, a purge front surface 21b, a rectifying back surface 32d, and an upper rectifying slope surface 32a (a rectifying surface). The first flow path part 30a includes a portion of which a flow path area decreases in a direction in which the nitrogen gas flows. Specifically, the first flow path part 30a includes a first portion between the purge front surface 21b and the rectifying back surface 32d, and a second portion between the purge front surface 21b and the upper rectifying slope surface 32a. A distance from the purge front surface 21b to the rectifying back surface 32d is constant. Therefore, the flow path area of the first portion is constant. On the other hand, the upper rectifying slope surface 32a is inclined with respect to the height direction Z. In other words, a lower side 32a1 of the upper rectifying slope surface 32a is located on an upstream side of an upper side 32a2 of the upper rectifying slope surface 32a in the transfer direction X. According to this configuration, the flow path area of the second portion gradually decreases toward the second flow path part 30b.

The socket 31 is provided on the purge upper surface 21a such that the axis A1 thereof is disposed substantially in a center between the purge front surface 21b and the rectifying back surface 32d. The axis A1 of the socket 31 intersects the upper rectifying slope surface 32a. In other words, the axis A1 of the socket 31 is disposed between the lower side 32a1 and the upper side 32a2 of the upper rectifying slope surface 32a in the transfer direction X. According to this configuration, the flow of the nitrogen gas received from the socket 31 collides with the upper rectifying slope surface 32a. Then, the nitrogen gas flows along the upper rectifying slope surface 32a. In other words, the nitrogen gas flows toward the upstream side in the transfer direction X. Then, the nitrogen gas reaches the second flow path part 30b.

The second flow path part 30b receives the nitrogen gas from the first flow path part 30a. Then, the second flow path part 30b provides the nitrogen gas to the third flow path part 30c. In other words, the second flow path part 30b guides the nitrogen gas to the target object 300 side in the height direction Z. The second flow path part 30b is a region surrounded by the purge front surface 21b and a rectifying upright surface 32b. A distance from the purge front surface 21b to the rectifying upright surface 32b is constant. For example, the distance from the purge front surface 21b to the rectifying upright surface 32b is about 4.5 mm. The flow path area of the second flow path part 30b is constant. The flow path area of the second flow path part 30b is smaller than a flow path area between the purge front surface 21b and the rectifying back surface 32d included in the first flow path part 30a. The flow path area of the second flow path part 30b is the same as a flow path area between the purge front surface 21b included in the first flow path part 30a and the lower side 32a1 of the upper rectifying slope surface 32a.

The third flow path part 30c receives the nitrogen gas from the second flow path part 30b. Then, the third flow path part 30c ejects the nitrogen gas from the first ejection port 30h and the second ejection port 35h. The third flow path part 30c includes a receiving part 30d that receives the compressed nitrogen gas. More specifically, the receiving part 30d is a region between the lower side 21b1 of the purge front surface 21b and a lower side 32b1 of the rectifying upright surface 32b. The third flow path part 30c is a region surrounded by a purge slope surface 21d and a lower rectifying slope surface 32c. The purge slope surface 21d extends from the lower side 21b1 of the purge front surface 21b toward the downstream side in the transfer direction X. That is, the lower side 21d1 of the purge slope surface 21d is disposed on the downstream side of the lower side 21b1 of the purge front surface 21b in the transfer direction X. Similarly, the lower rectifying slope surface 32c extends from the lower side 32b1 of the rectifying upright surface 32b toward the downstream side in the transfer direction X. In other words, the lower side 32c1 of the lower rectifying slope surface 32c is disposed on the downstream side of the lower side 32b1 of the rectifying upright surface 32b in the transfer direction X.

The purge slope surface 21d is provided with the second ejection port 35h. The second ejection port 35h is a rectangular opening extending in the width direction Y. The second ejection port 35 is a slit. The second ejection port 35h overlaps the lower rectifying slope surface 32c when viewed in the height direction Z. In other words, the second ejection port 35h does not overlap the second flow path part 30b when viewed in the height direction Z. A distance from the lower side 21b1 of the purge front surface 21b to the second ejection port 35h is shorter than a distance from the lower side 21d1 of the purge slope surface 21d to the second ejection port 35h. The second ejection port 35h is disposed in the vicinity of the purge front surface 21b.

A distance between the purge slope surface 21d and the lower rectifying slope surface 32c may be constant in a direction in which the purge slope surface 21d and the lower rectifying slope surface 32c extend. Therefore, a flow path area of the third flow path part 30c is constant in the extending direction of the purge slope surface 21d and the lower rectifying slope surface 32c.

When a flow path area is said to be constant, it needs not be strictly constant in a dimensional number. In the present embodiment, when a flow path area is said to be constant, it functionally indicates that a state of the nitrogen gas flowing through the third flow path part 30c does not change significantly. According to Bernoulli's theorem, a flow velocity and a pressure change as a flow path area change. That is, when a flow path area is said to be constant in the present embodiment, it indicates that there is no significant change between a flow velocity and a pressure at an inlet (the receiving part 30d) of the third flow path part 30c and a flow velocity and a pressure at an outlet of the third flow path part 30c (first ejection port 30h).

In the active energy radiation unit 1 of the present embodiment, the flow path area of the third flow path part 30c is constant. However, the flow path area of the third flow path part 30c may not necessarily be constant. That is, the flow path area of the third flow path part 30c may be gradually enlarged. Further, the flow path area of the third flow path part 30c may be gradually reduced.

The nitrogen gas ejected from the first ejection port 30h of the third flow path part 30c forms a first flow F1. The first flow F1 flows in a direction of the third flow path part 30c. The first flow F1 flows toward the downstream side in the transfer direction X. As a result, the purge region S20 is formed.

The nitrogen gas ejected from the second ejection port 35h of the third flow path part 30c forms a second flow F2. The second flow F2 flows toward the target object 300. The first flow F1 also finally flows along the target object 300. Therefore, it can be said that the first flow F1 also flows toward the target object 300. However, the fact that the second flow F2 flows toward the target object 300 indicates that the second flow F2 moves from the second ejection port 35h to the target object 300 in a short distance. For example, a direction of the second flow F2 is vertically downward from the second ejection port 35h (negative height direction Z). The second flow F2 forms an air curtain. In other words, the second flow F2 from the second ejection port 35h to the target object 300 does not substantially have a component directed downstream in the transfer direction X. The second flow F2 after reaching the target object 300 is mainly directed upstream (negative transfer direction X) along the surface of the target object 300. Also, the second flow F2 after reaching the surface of the target object 300 may include a portion that flows downstream (positive transfer direction X) along the surface.

According to the first flow F1, the purge region S20 can be formed. Further, according to the second flow F2, entrance of the air can be inhibited.

In order to generate the first flow F1, a direction in which the third flow path part 30c extends (the direction in which the nitrogen gas flows), a length L1 of the third flow path part 30c, an opening length L2 of the first ejection port 30h, and a projection length L3 of the third flow path part 30c may be set appropriately. The length L1 of the third flow path part 30c may be, for example, a length from the lower side 32b1 of the rectifying upright surface 32b to the lower side 32c1 of the lower rectifying slope surface 32c. In addition, the opening length L2 of the first ejection port 30h may be a length in the transfer direction X from the lower side 21d1 of the purge slope surface 21d to the lower side 32c1 of the lower rectifying slope surface 32c. The projection length L3 may be a length in the transfer direction X from the lower side 21b1 of the purge front surface 21b to the lower side 21d1 of the purge slope surface 21d. The projection length L3 may be, for example, 15 mm. Further, for example, an angle of the purge slope surface 21d with respect to the transfer direction X can be exemplified as 30 degrees.

<Sub Gas Supply Mechanism>

Figure 5:
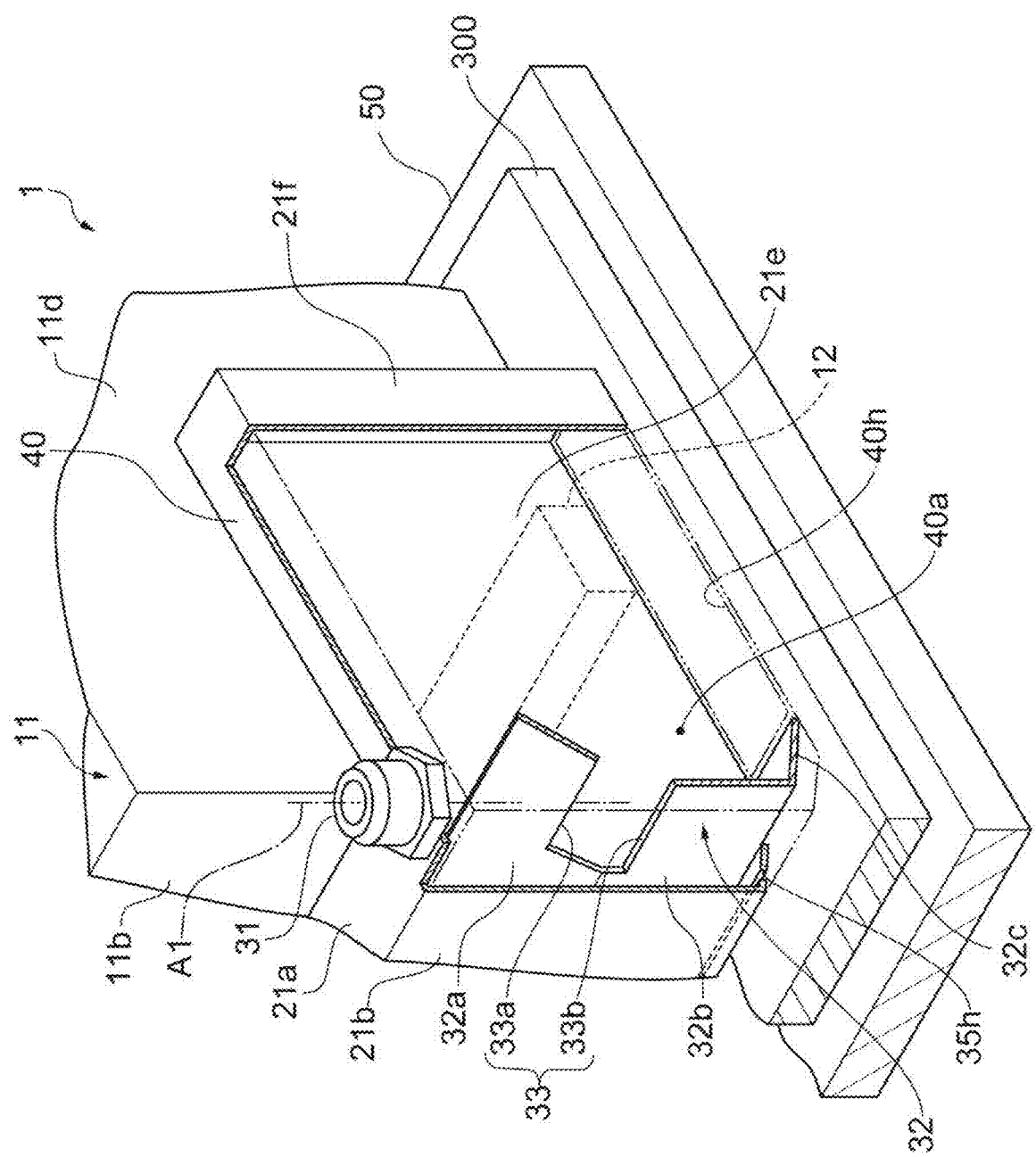
FIG. 5 is a perspective view showing a sub gas supply mechanism.

As shown in FIG. 5, the sub gas supply mechanism 40 has a third ejection port 40h. The sub gas supply mechanism 40 ejects the nitrogen gas for blocking an airflow that tries to enter the gap between the target object 300 and the active energy radiation unit 1 from the third ejection port 40h. Here, the air that tries to enter the gap between the target object 300 and the active energy radiation unit 1 as the target object 300 moves is not only from the upstream side of the active energy radiation unit 1 (that is, the radiation front surface 11b side). The air also tries to enter the gap between the target object 300 and the active energy radiation unit 1 from the radiation side surface 11d sides of the active energy radiation unit 1. The sub gas supply mechanism 40 discharges the nitrogen gas for blocking the airflow from the radiation side surfaces 11d of the active energy radiation unit 1.

The sub gas supply mechanism 40 is attached to each of the pair of radiation side surfaces 11d of the radiation housing 11. More specifically, the sub gas supply mechanism 40 extends from the radiation front surface 11b toward the radiation back surface 11c. That is, the third ejection port 40h of the sub gas supply mechanism 40 extends from the radiation front surface 11b toward the radiation back surface 11c. A front end of the sub gas supply mechanism 40 is disposed in the vicinity of the radiation front surface 11b of the radiation housing 11. In other words, the front end of the sub gas supply mechanism 40 is disposed on the upstream side of the light source 12. A rear end of the sub gas supply mechanism 40 is disposed between the radiation front surface 11b and the radiation back surface 11c of the radiation housing 11. For example, the rear end of the sub gas supply mechanism 40 may be disposed on the downstream side of the light source 12.

According to such a configuration, the light source 12 is disposed in a region surrounded by the main gas supply mechanism 30 and the sub gas supply mechanism 40. The light source 12 is disposed in a region surrounded by the purge part 20.

The sub gas supply mechanism 40 receives the nitrogen gas from an opening 33 provided in the rectifying plate 32. More specifically, the opening 33 includes a slope surface opening 33a provided on the upper rectifying slope surface 32a and an upright surface opening 33b provided on the rectifying upright surface 32b. The slope surface opening 33a is provided on a lower side of the upper rectifying slope surface 32a. The upright surface opening 33b is provided on an upper side of the rectifying upright surface 32b. Positions of the openings 33 in the width direction Y correspond to positions of the sockets 31 disposed at both ends of the plurality of sockets 31 in the width direction Y. Further, a position of the slope surface opening 33a in the transfer direction X does not overlap the axis A1 of the socket 31. The position of the slope surface opening 33a is on the upstream side in the transfer direction X with respect to the axis A1 of the socket 31.

According to this configuration, the nitrogen gas introduced from the socket 31 first collides with the upper rectifying slope surface 32a. Next, the nitrogen gas moves downward along the upper rectifying slope surface 32a. Then, the nitrogen gas flows into a fourth flow path part 40a from the slope surface opening 33a. The fourth flow path part 40a is a region surrounded by an inner purge side surface 21e of the purge housing 21 and an outer purge side surface 21f of the purge housing 21. Also, a surface that surrounds the fourth flow path part 40a may include the radiation side surface 11d of the radiation housing 11. No wall is provided on a lower surface side of the purge housing 21. The lower surface of the purge housing 21 includes an opening. This opening is the third ejection port 40h.

<Operations and Effects>

The active energy radiation unit 1 and the active energy radiation device 100 have the main gas supply mechanism 30 disposed on the upstream side of the light source 12 in the transfer direction X of the target object 300. When the nitrogen gas is ejected from the first ejection port 30h of the main gas supply mechanism 30, the nitrogen gas becomes the first flow F1 and flows downstream. As a result, the purge region S20 having a low oxygen concentration is formed around the active energy radiation region S10. The main gas supply mechanism 30 receives the nitrogen gas from the receiving part 30d and ejects the nitrogen gas from the second ejection port 35h. The second ejection port 35h is disposed on the upstream side of the first ejection port 30h in the transfer direction X. From the second ejection port 35h, the vertically downward second flow F2 is generated toward the target object 300. As described above, the first flow F1 forms the purge region S20 having a low oxygen concentration around the active energy radiation region S10. Movements of the first flow F1 and the target object 300 induce an airflow from the upstream side of the active energy radiation unit 1 toward the active energy radiation region S10. That is, the air containing oxygen is supplied toward the active energy radiation region S10. On the other hand, the second flow F2 flows vertically downward toward the target object 300. The vertically downward second flow F2 can block the airflow. Therefore, the active energy radiation unit 1 and the active energy radiation device 100 can form the purge region S20 around the active energy radiation region S10 by supplying the nitrogen gas to the active energy radiation region S10. Furthermore, the active energy radiation unit 1 and the active energy radiation device 100 can block the air supplied from surroundings to the active energy radiation region S10. As a result, the region in which the oxygen concentration is kept low in the vicinity of the active energy radiation region S10 is enlarged. Therefore, the region in which a desired optical processing result is obtained can be enlarged.

The length of the first ejection port 30h in the width direction Y is longer than the length of the light source 12 in the width direction Y. According to this configuration, the purge region S20 including the active energy radiation region S10 can be reliably formed. Therefore, the air supplied to the active energy radiation region S10 from the upstream side can be reliably blocked.

Figure 6:
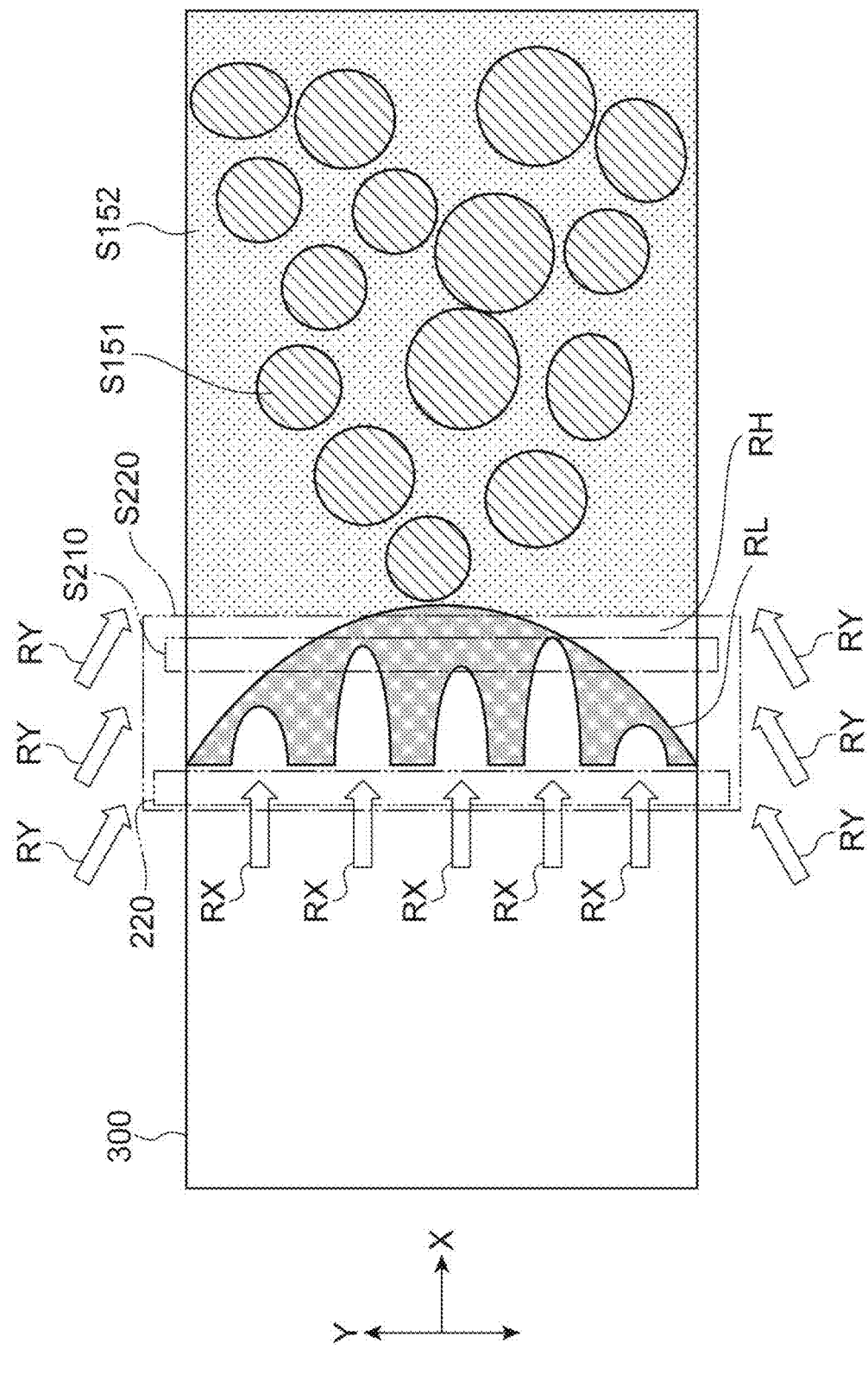
FIG. 6 is a diagram for explaining an effect of an active energy radiation unit of a comparative example.
Figure 7:
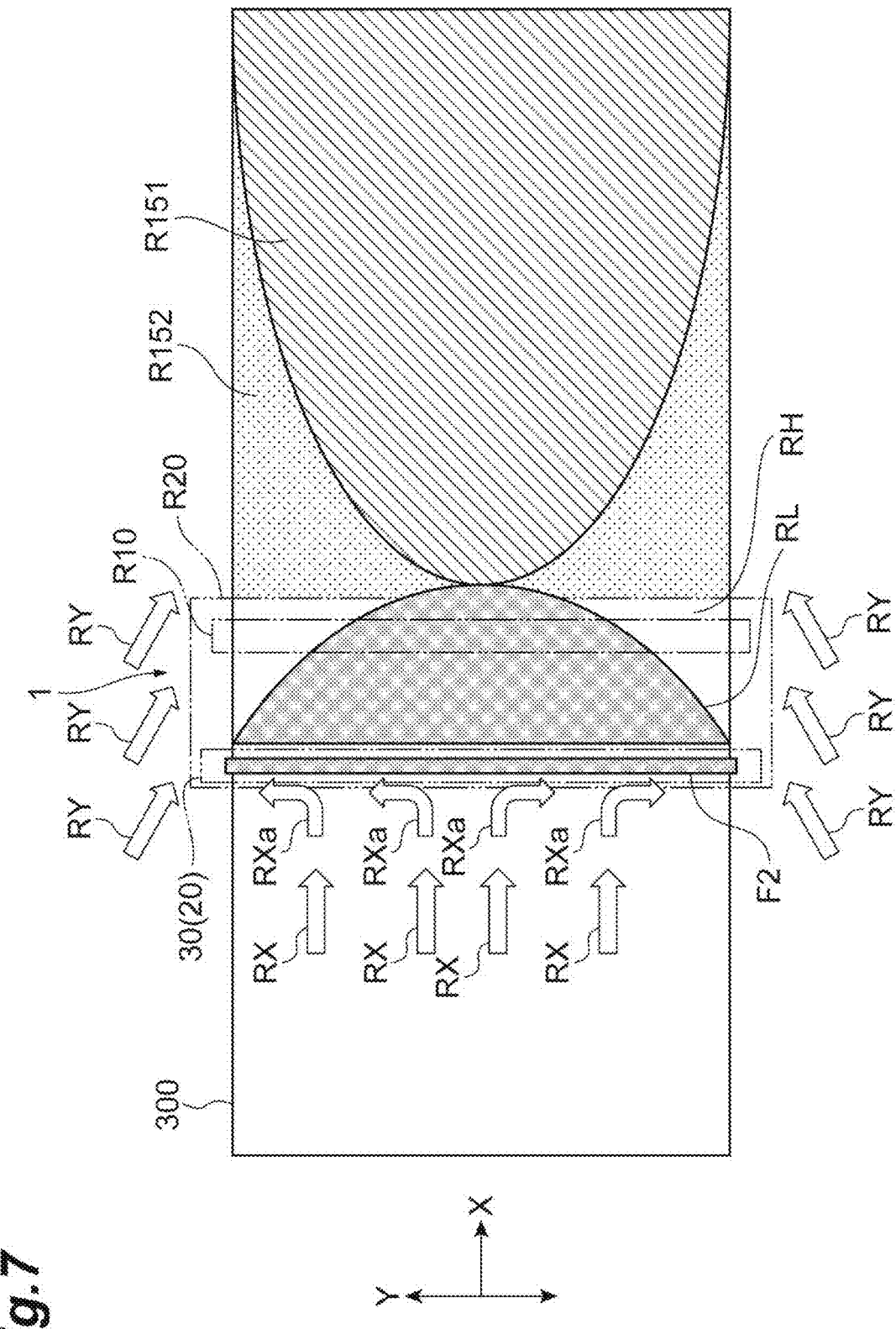
FIG. 7 is a diagram for explaining an effect of the main gas supply mechanism of the embodiment.

Operations and effects of the main gas supply mechanism 30 in the purge part 20 will be further described with reference to FIGS. 6 and 7. FIG. 6 is a diagram for explaining an operation of an active energy radiation unit of a comparative example. The active energy radiation unit of the comparative example includes a purge part 220. The purge part 220 generates only the first flow F1 of nitrogen gas. That is, the purge part 220 does not generate the second flow F2. Similarly, the purge part 220 does not include a configuration corresponding to the sub gas supply mechanism 40. FIG. 7 is a diagram for explaining an operation of the main gas supply mechanism 30 included in the active energy radiation unit 1. In order to pay attention to an operation of the main gas supply mechanism 30, the sub gas supply mechanism 40 is not shown.

As shown in FIG. 6, the active energy radiation unit ejects the nitrogen gas from the purge part 220. The nitrogen gas forms a purge region S220 including an active energy radiation region S210. However, the purge region S220 is supplied with air (arrow RX) from the upstream side as the target object 300 moves. Further, air RY is also supplied from side portions of the active energy radiation unit. As a result, the purge region S220 includes a region RH having a high oxygen concentration (a region having a low nitrogen concentration) and a region RL having a low oxygen concentration (a region having a high nitrogen concentration) due to the air supplied from the surroundings. That is, the oxygen concentration in the purge region S220 is non-uniform. When the oxygen concentration in the purge region S220 is non-uniform, a variation in a dried degree of a resin film occurs on the downstream side of the active energy radiation region S210. Specifically, regions S151 in which the dried degree is sufficient and regions S152 in which the dried degree is insufficient are randomly distributed.

On the other hand, in the active energy radiation unit 1 shown in FIG. 7, in addition to the first flow F1 of the nitrogen gas from the purge part 20, the second flow F2 of the nitrogen gas is further generated. The second flow F2 hinders an air supply from the upstream side of the active energy radiation unit 1 (see arrow RXa in FIG. 7). As a result, the non-uniform oxygen concentration in the purge region S20 caused by the air supplied from the upstream side is eliminated. Therefore, the region RL in which the oxygen concentration is kept low and the variation in the oxygen concentration is reduced is enlarged. As a result, the region in which a desired optical processing result is obtained can be enlarged.

The active energy radiation unit 1 further includes the sub gas supply mechanism 40 that extends in the transfer direction X and is disposed to sandwich the active energy radiation region S10 and ejects the nitrogen gas. One end of the sub gas supply mechanism 40 is connected to the main gas supply mechanism 30. The other end of the sub gas supply mechanism 40 is disposed on the downstream side of the light source 12 in the transfer direction X. The airflow toward the active energy radiation region S10 is provided from the upstream side of the active energy radiation region S10. Further, the airflow toward the active energy radiation region S10 is also provided from the side portion sides of the active energy radiation region S10. According to the sub gas supply mechanism 40, the airflow from the side portion sides of the active energy radiation region S10 toward the active energy radiation region S10 can be blocked. As a result, the light source 12 is disposed in the region surrounded by the main gas supply mechanism 30 and the sub gas supply mechanism 40. Therefore, the purge region S20 including the active energy radiation region S10 can be reliably formed. That is, the region in which a desired optical processing result is obtained can be further enlarged.

Figure 8:
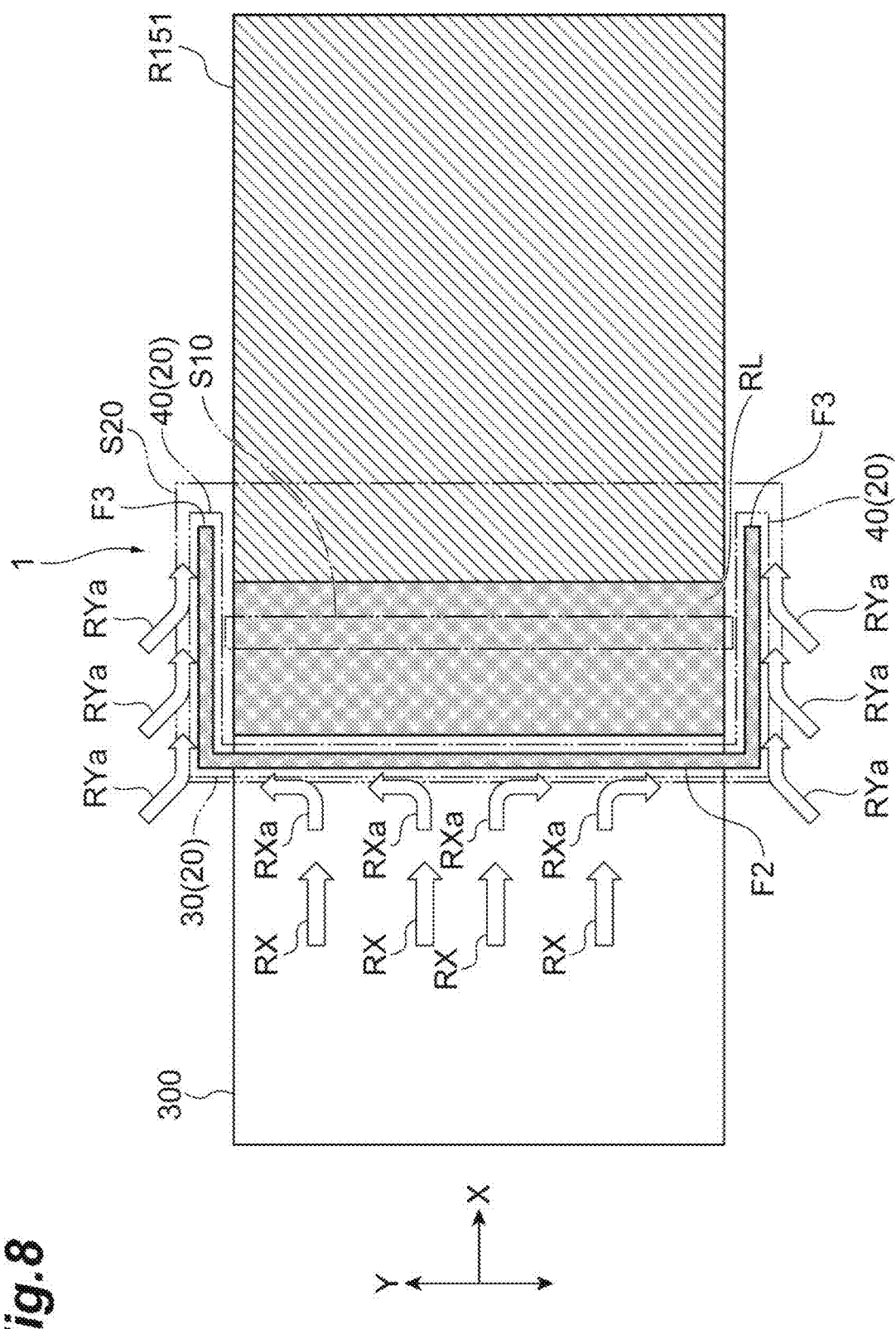
FIG. 8 is a diagram for explaining an effect of the sub gas supply mechanism of the embodiment.

As shown in FIG. 7, the region RL having a low oxygen concentration and a reduced variation in oxygen concentration is formed by the second flow F2 generated by the main gas supply mechanism 30. As shown in FIG. 8, the sub gas supply mechanism 40 inhibits the air supply from the side portion sides of the active energy radiation unit 1 using the third flow F3 (see arrow RYa in FIG. 8). As a result, according to the sub gas supply mechanism 40, the region RL having a low oxygen concentration and a reduced variation in oxygen concentration is further enlarged.

The main gas supply mechanism 30 further has the socket 31 to which a gas pipe for supplying the compressed nitrogen gas is connected, the first flow path part 30a which receives the nitrogen gas from the socket 31, and the second flow path part 30b which receives the nitrogen gas from the first flow path part 30a and provides the receiving part 30d with the nitrogen gas. The flow path area of the first flow path part 30a is larger than the flow path areas of the socket 31 and the second flow path part 30b. The first flow path part 30a is disposed to intersect the axis A1 of the socket 31 and includes the rectifying plate 32 which blocks the flow of the nitrogen gas received from the socket 31. According to this configuration, the flow of the nitrogen gas received from the socket 31 spreads in the width direction Y due to two operations, the operation of the movement from the socket 31 to the first flow path part 30a resulting in the enlargement of the flow path area and the operation of the rectifying plate 32 inhibiting the flow of the nitrogen gas. As a result, a distribution of a flow rate of the nitrogen gas ejected from the first ejection port 30h and the second ejection port 35h in the width direction Y becomes uniform. Therefore, the flow rate of the nitrogen gas required to form the purge region S20 can be reduced.

The rectifying plate 32 has the upper rectifying slope surface 32a as a surface for inhibiting the flow of the nitrogen gas. The rectifying plate 32 forms a flow path whose flow path area gradually decreases. According to this flow path, operating noises of the main gas supply mechanism 30 can be reduced.

The effects of the rectifying plate 32 was confirmed using numerical analysis. In analysis example 1, a flow generated by the purge part 220 not including the rectifying plate 32 as a comparative example was analyzed. In analysis example 2, a flow generated by the purge part 20 including the rectifying plate 32 was analyzed. Conditions for supplying the nitrogen gas from the socket 31 were set as analysis conditions. Then, under these conditions, states of gas flows generated by the purge parts 220 and 20 were obtained through analysis. Furthermore, the gas flow after being ejected from the first ejection port 30h and the second ejection port 35h of the main gas supply mechanism 30 and the gas flow after being ejected from the third ejection port 40h of the sub gas supply mechanism 40 were obtained through analysis.

Analysis Example 1: Without Rectifying Plate

Figure 9:
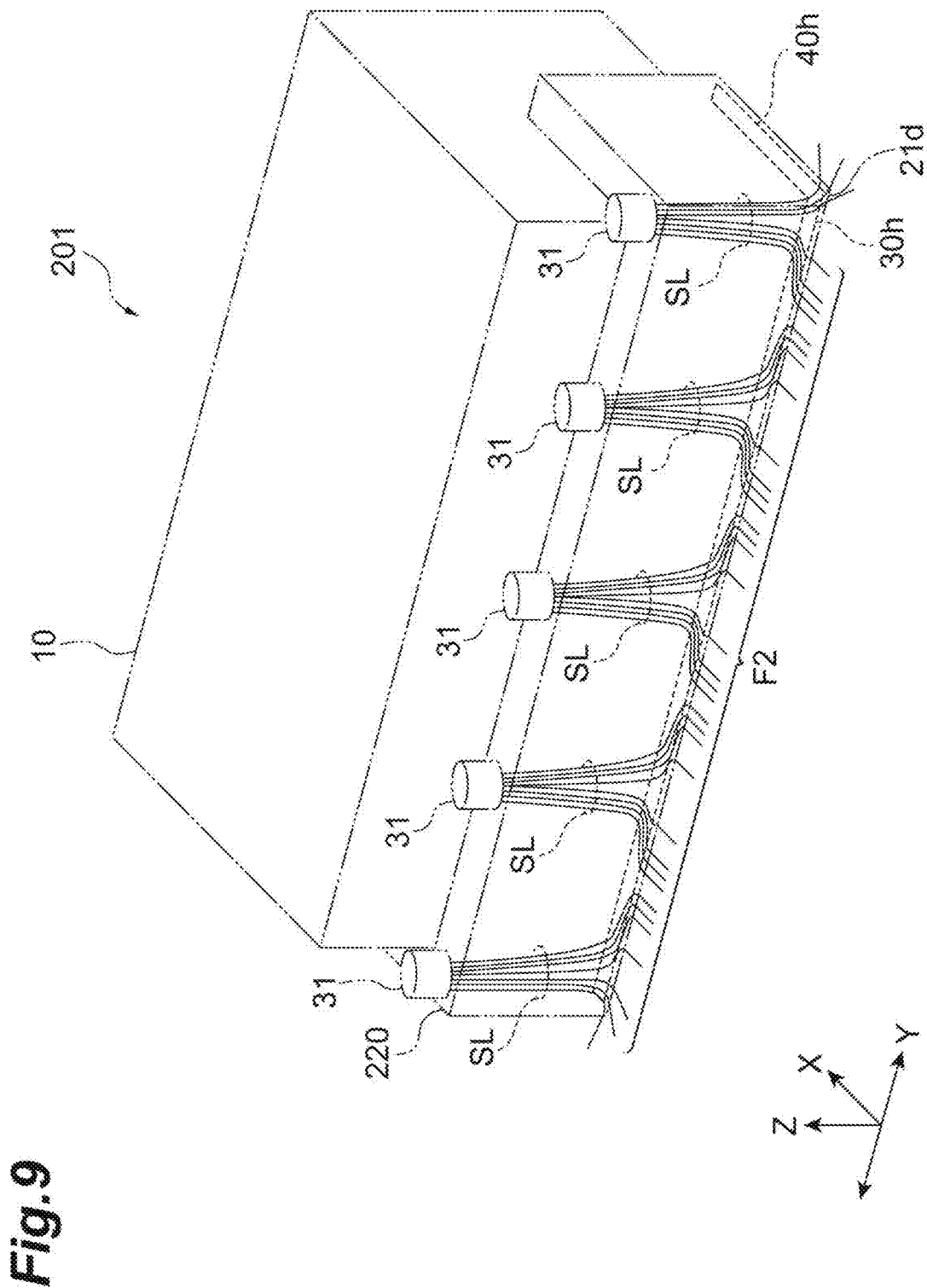
FIG. 9 is a perspective view showing a result of analyzing a gas flow generated by a purge mechanism of the comparative example.
Figure 10:
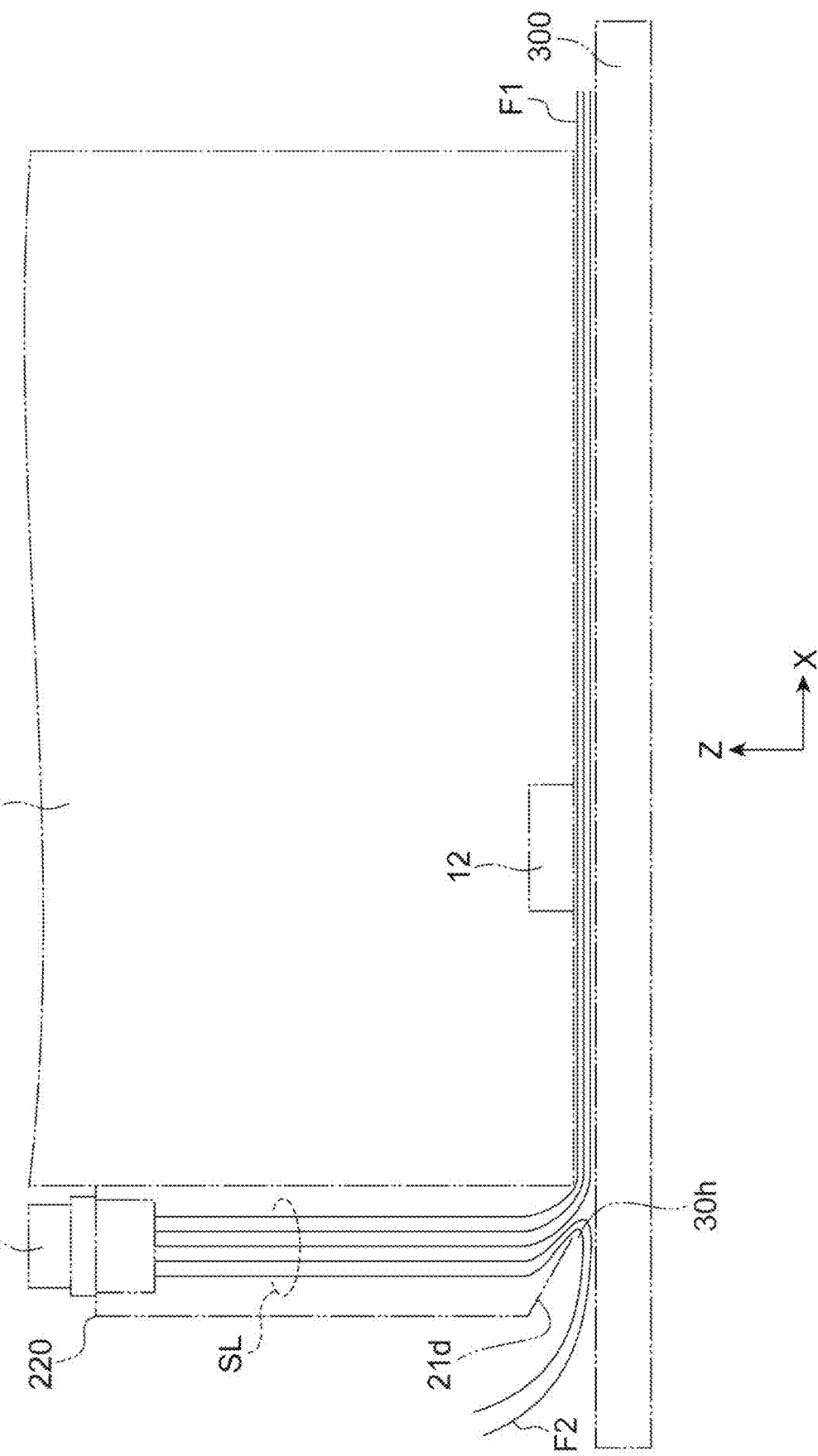
FIG. 10 is a side view showing a result of analyzing the gas flow generated by a purge part of the comparative example.
Figure 11:
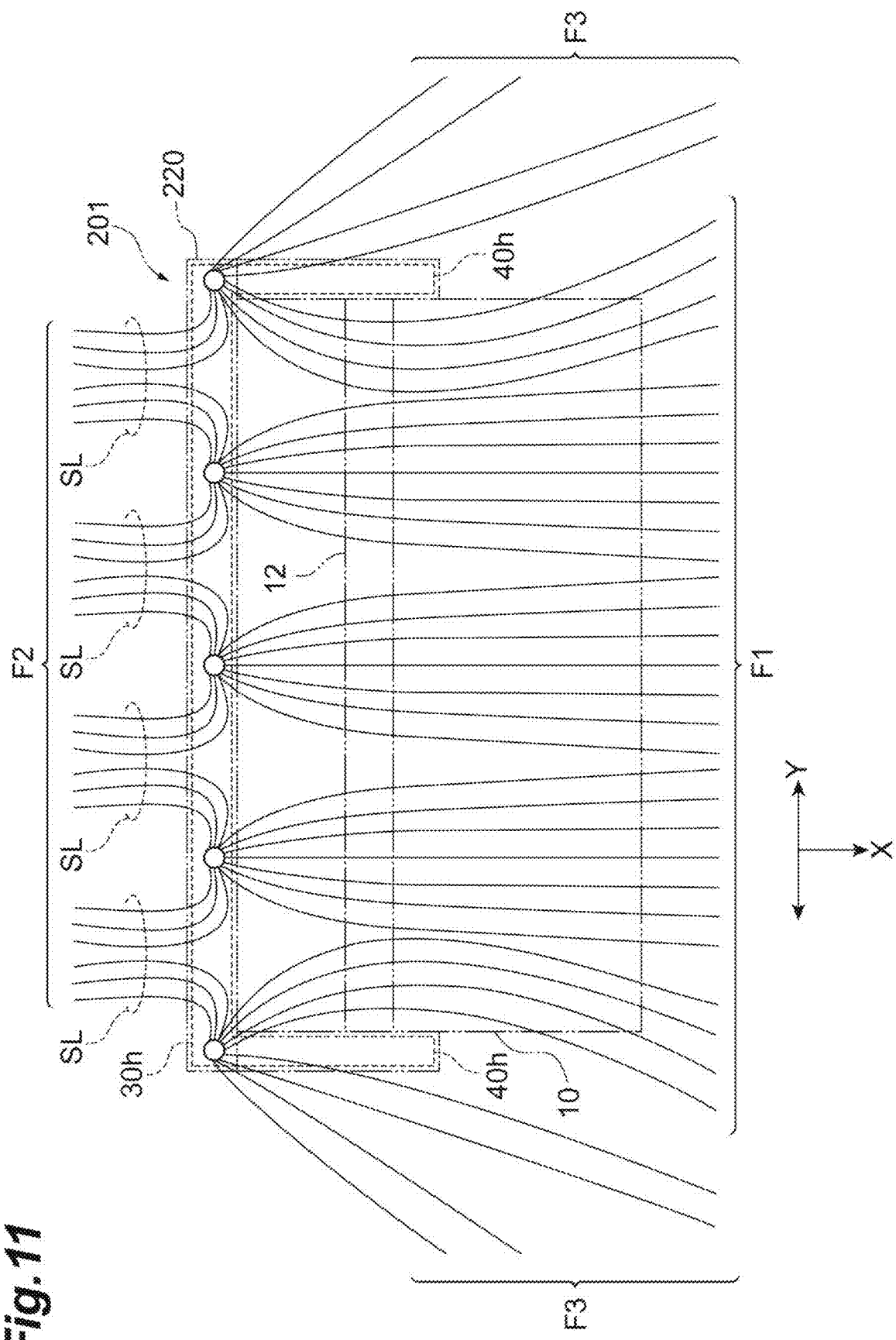
FIG. 11 is a bottom view showing a result of analyzing the gas flow generated by the purge part of the comparative example.

FIGS. 9, 10 and 11 are diagrams showing results of the analysis example 1. In each figure, a flow state thereof is indicated by a plurality of streamlines SL. In FIGS. 9, 10 and 11, the streamlines SL are shown as solid lines. With reference to FIGS. 9 and 10, it was found that a gas ejected from the socket 31 linearly flows until it reaches the purge slope surface 21d. Then, it was found that the gas reaching the purge slope surface 21d spreads in the width direction Y and then is ejected from the first ejection port 30h and the third ejection port 40h. With reference to FIG. 11, it was found that there was a variation in density of the streamlines SL in the width direction Y. Presence of the variation in density of the streamlines SL suggests that there is a variation in gas flow rate in the width direction Y. That is, it was found that a variation in a flow rate distribution of the ejected gas in the width direction Y occurs in a case in which the rectifying plate 32 is not provided. In a case in which such a variation exists, the gas is supplied from the socket 31 such that the minimum flow rate in the variation satisfies a minimum flow rate for forming the purge region S20. That is, it was found that there is a possibility that a large amount of gas may be necessary to be supplied in order to form the purge region S20 in a case in which the rectifying plate 32 is not provided.

Analysis Example 2: With Rectifying Plate

Figure 12:
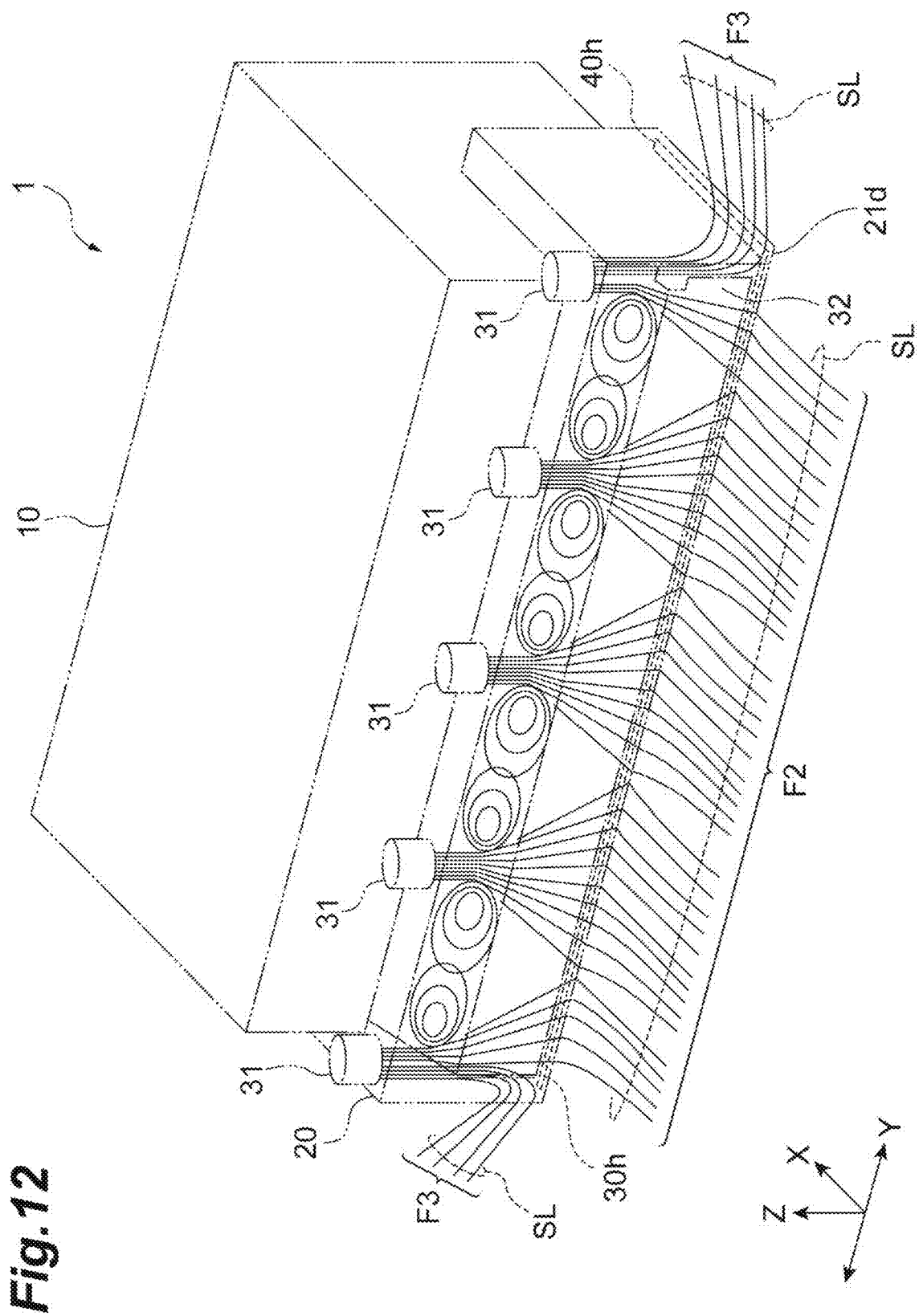
FIG. 12 is a perspective view showing a result of analyzing a gas flow generated by a purge part of the embodiment.
Figure 13:
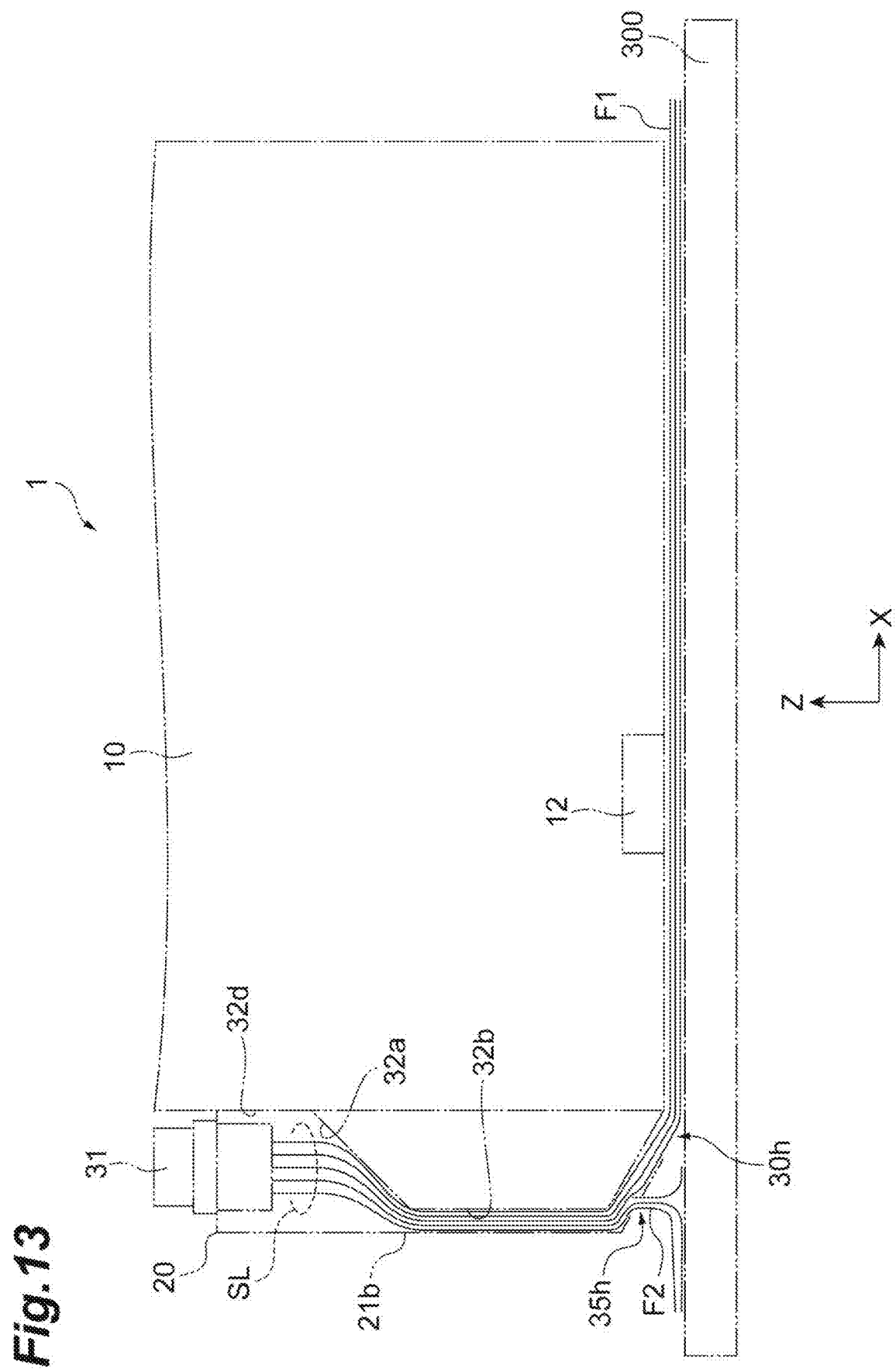
FIG. 13 is a side view showing a result of analyzing the gas flow generated by the purge part of the embodiment.
Figure 14:
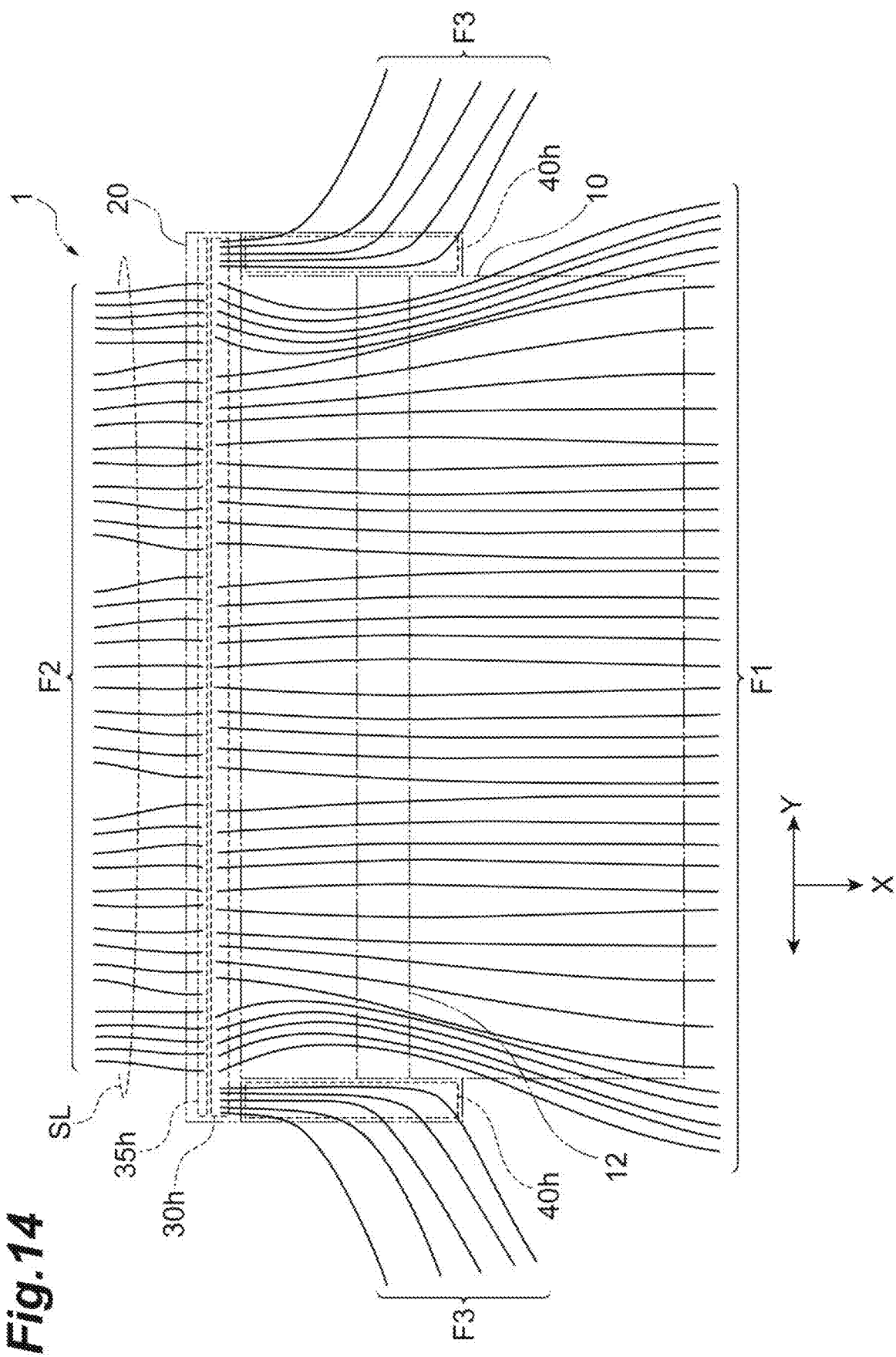
FIG. 14 is a bottom view showing a result of analyzing the gas flow generated by the purge part of the embodiment.

FIGS. 12, 13 and 14 are diagrams showing results of the analysis example 2. In each figure, a flow state thereof is indicated by a plurality of streamlines SL. Referring to FIGS. 12 and 13, the gas ejected from the socket 31 flows straight until it reaches the upper rectifying slope surface 32a. Then, the gas spreads in the width direction Y during it flows along the upper rectifying slope surface 32a. Then, the gas further spreads in the width direction Y in the second flow path part 30b. As a result, when the gas is ejected from the first ejection port 30h and the second ejection port 35h via the third flow path part 30c, the gas flow rate distribution in the width direction Y becomes substantially uniform. This situation can be better understood with reference to FIG. 14. According to FIG. 14, it was found that the first flow F1 which was directed to the downstream side in the gas flow ejected from the first ejection port 30h was distributed substantially uniformly in the width direction Y. Similarly, it was found that the second flow F2 which was ejected from the second ejection port 35h and directed to the upstream side was also distributed substantially uniformly in the width direction. That is, it was found that the variation in the flow rate of the gas ejected in the width direction Y is reduced in the case in which the rectifying plate 32 is provided. Therefore, it was found that the configuration including the rectifying plate 32 can reduce an amount of gas required to form the purge region S20 as compared with the configuration including no rectifying plate 32.

Also, the active energy radiation unit and the active energy radiation device according to the present disclosure are not limited to the above embodiment. The active energy radiation unit and the active energy radiation device may be implemented in various forms without being limited to the above embodiment.

Figure 15:
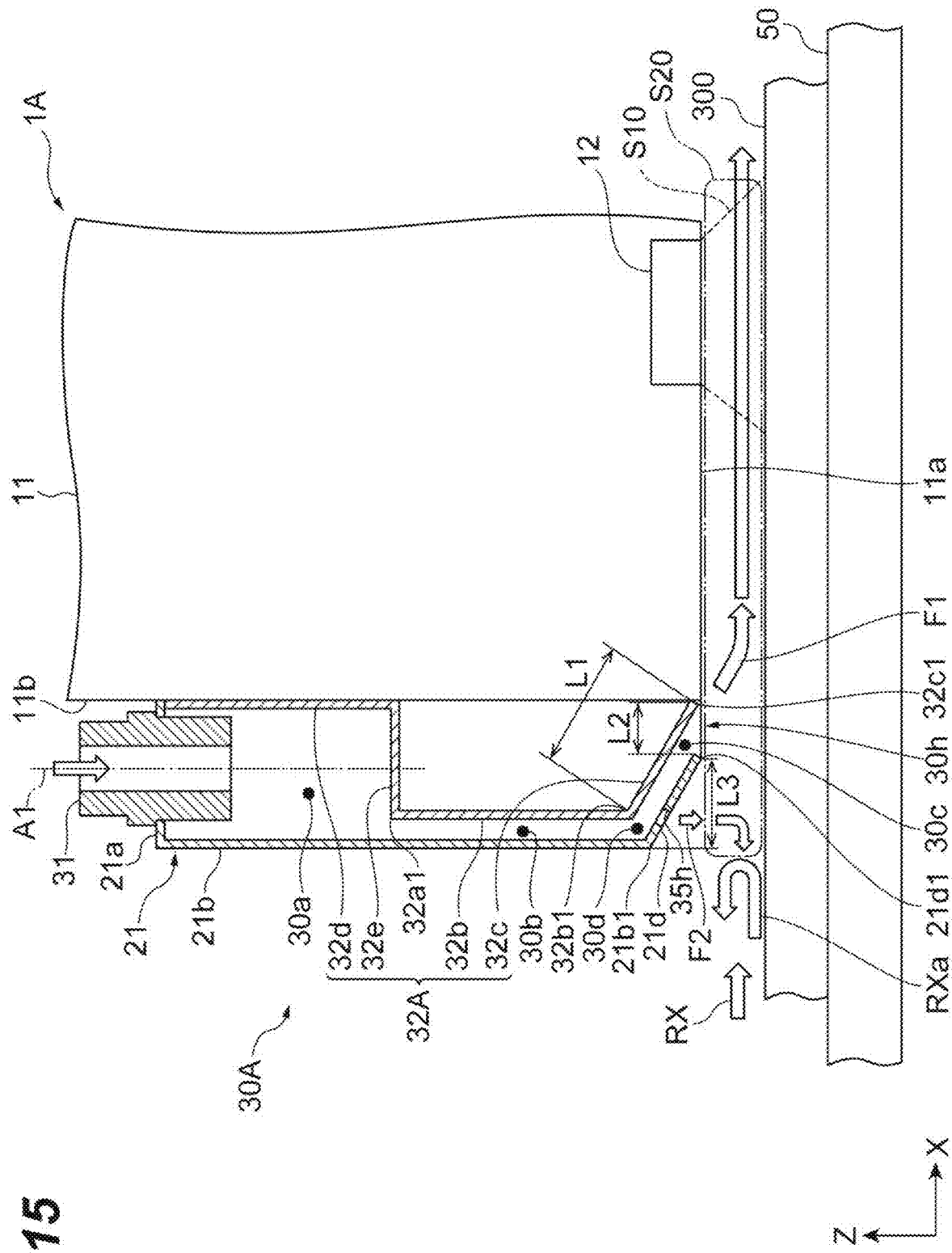
FIG. 15 is a cross-sectional view showing a main gas supply mechanism included in an active energy radiation unit of a modified example.

For example, as shown in FIG. 15, the active energy radiation unit 1A has the main gas supply mechanism 30A. The main gas supply mechanism 30A has a rectifying plate 32A. This rectifying plate 32A has a rectifying plane 32e instead of the upper rectifying slope surface 32a described in the embodiment. That is, the surface on with which the flow of the nitrogen gas received from the socket 31 collides does not have to be inclined with respect to the direction of the flow of the nitrogen gas. That is, the surface with which the flow of nitrogen gas collides may be orthogonal to the direction of the gas flow like the rectifying plane 32e. The rectifying plate 32A adopts a configuration that sharply reduces the flow path area like, such as an L shape. In the case of adopting the configuration in which the flow path area is sharply reduced, the region of the first flow path part 30a may be expanded as compared to the case of adopting the configuration in which the flow path area is gradually reduced (the case of the main gas supply mechanism 30 of the embodiment). Even with such a flow path configuration, the flow of the nitrogen gas received from the socket 31 can spread in the width direction Y due to the two operations, the operation of the movement from the socket 31 to the first flow path part 30a resulting in the enlargement of the flow path area and the operation of the rectifying plate 32A inhibiting the flow of the nitrogen gas. That is, it is possible to make the flow rate distribution of the nitrogen gas ejected from the first ejection port 30h in the width direction Y uniform. Therefore, the flow rate of the nitrogen gas required to form the purge region S20 can be reduced.

In the above-described embodiment, the active energy radiation unit 1 exemplifies a configuration in which the target object 300 moved by the transfer device 50 is irradiated with the active energy rays. The target object 300 that receives the active energy rays from the active energy radiation unit 1 does not need to move. That is, the active energy radiation unit 1 may irradiate a stationary target object 300 with the active energy rays. In this case, both the active energy radiation unit 1 and the target object 300 may be stationary. Alternatively, only the target object 300 may be stationary, and the transfer device 50 may move the active energy radiation unit 1 with respect to the target object 300.

What is claimed is:

1. An active energy radiation unit comprising:
an active energy radiation part which radiates active energy rays onto a target object disposed in an active energy radiation region extending in a first direction; and
a main gas supply mechanism which extends in the first direction, is disposed to be adjacent to the active energy radiation part in a second direction intersecting the first direction, and ejects an inert gas for forming an inactive region including the active energy radiation region between the target object and the active energy radiation part,
wherein the main gas supply mechanism includes a receiving part which receives the inert gas, a first ejection port which is provided between the receiving part and the active energy radiation part in the second direction and is closer to the target object than the receiving part, and a second ejection port which is provided between the receiving part and the first ejection port in the second direction.

2. The active energy radiation unit according to claim 1 further comprising a sub gas supply mechanism which extends in the second direction, is disposed to sandwich the active energy radiation region in the first direction, and ejects the inert gas.

3. The active energy radiation unit according to claim 2, wherein one end of the sub gas supply mechanism in the second direction is connected to the main gas supply mechanism, and
the active energy radiation part is disposed between the one end of the sub gas supply mechanism and the other end of the sub gas supply mechanism in the second direction.

4. The active energy radiation unit according to claim 1, wherein the main gas supply mechanism further includes an introduction part to which a gas pipe for supplying a compressed inert gas is connected, a first flow path part which receives the inert gas from the introduction part, and a second flow path part which receives the inert gas from the first flow path part and provides the inert gas to the receiving part,
a flow path area of the first flow path part is larger than flow path areas of the introduction part and the second flow path part, and
the first flow path part is formed by a rectifying surface which is disposed to intersect an axis of the introduction part and obstructs a flow of the inert gas received from the introduction part.

5. The active energy radiation unit according to claim 4, wherein the rectifying surface is a slope surface that is inclined with respect to the axis of the introduction part.

6. An active energy radiation device comprising:
the active energy radiation unit according to claim 1; and
a transfer part which causes a relative movement of the target object with respect to the active energy radiation region.

7. The active energy radiation device according to claim 6,
wherein the transfer part transfers the target object, and the second direction is a transfer direction of the target object.

* * * * *